(12) United States Patent
Iwata

(10) Patent No.: US 7,549,739 B2
(45) Date of Patent: Jun. 23, 2009

(54) LIQUID DROPLET DISCHARGE APPARATUS, LIQUID SUPPLY DEVICE THEREOF, ELECTRO-OPTICAL DEVICE, AND ELECTRONIC APPARATUS

(75) Inventor: Yuji Iwata, Nagano (JP)

(73) Assignee: Seiko Epson Corporation (JP)

( * ) Notice: Subject to any disclaimer, the term of this patent is extended or adjusted under 35 U.S.C. 154(b) by 746 days.

(21) Appl. No.: 11/203,458

(22) Filed: Aug. 12, 2005

(65) Prior Publication Data

US 2006/0048647 A1    Mar. 9, 2006

(30) Foreign Application Priority Data

Sep. 7, 2004    (JP)    ............... 2004-259330

(51) Int. Cl.
B41J 2/18    (2006.01)
B41J 2/19    (2006.01)

(52) U.S. Cl. .......................................... 347/89; 347/92
(58) Field of Classification Search .................. 347/85, 347/89, 92; 55/323, 330; 96/4, 189, 191; 210/188, 323.1, 323.2, 348, 472
See application file for complete search history.

(56) References Cited

U.S. PATENT DOCUMENTS 5,645,625 A * 7/1997 van Schravendijk et al. ... 95/46
6,033,475 A 3/2000 Hasebe et al.
6,402,821 B1 * 6/2002 Matsuyama .................. 96/175
6,648,945 B1 * 11/2003 Takeda et al. .................. 95/46
6,675,835 B2 * 1/2004 Gerner et al. .................. 138/30

FOREIGN PATENT DOCUMENTS

| JP | 57-200866 | 6/1982 |
| JP | 61-053052 | 3/1986 |
| JP | 02-129203 | 10/1990 |
| JP | 09-007936 | 1/1997 |

* cited by examiner

Primary Examiner—Anh T. N. Vo
(74) Attorney, Agent, or Firm—Harness, Dickey & Pierce, P.L.C.

(57) ABSTRACT

A liquid droplet discharge apparatus that discharges liquid droplets onto a work includes a liquid container that contains liquid, a head that discharges the liquid droplets, and a liquid supply device that is disposed between the liquid container and the head and that supplies the liquid from the liquid container to the head. The liquid supply device includes a first tube connected between the liquid container and the head that supplies the liquid, a second tube surrounding an outer circumference of the first tube, and a fluid circulating unit that contains deaerating fluid in a space defined between the first tube and the second tube to circulate the deaerating fluid while deaerating gases contained in the deaerating fluid to outside the second tube through the second tube.

9 Claims, 15 Drawing Sheets

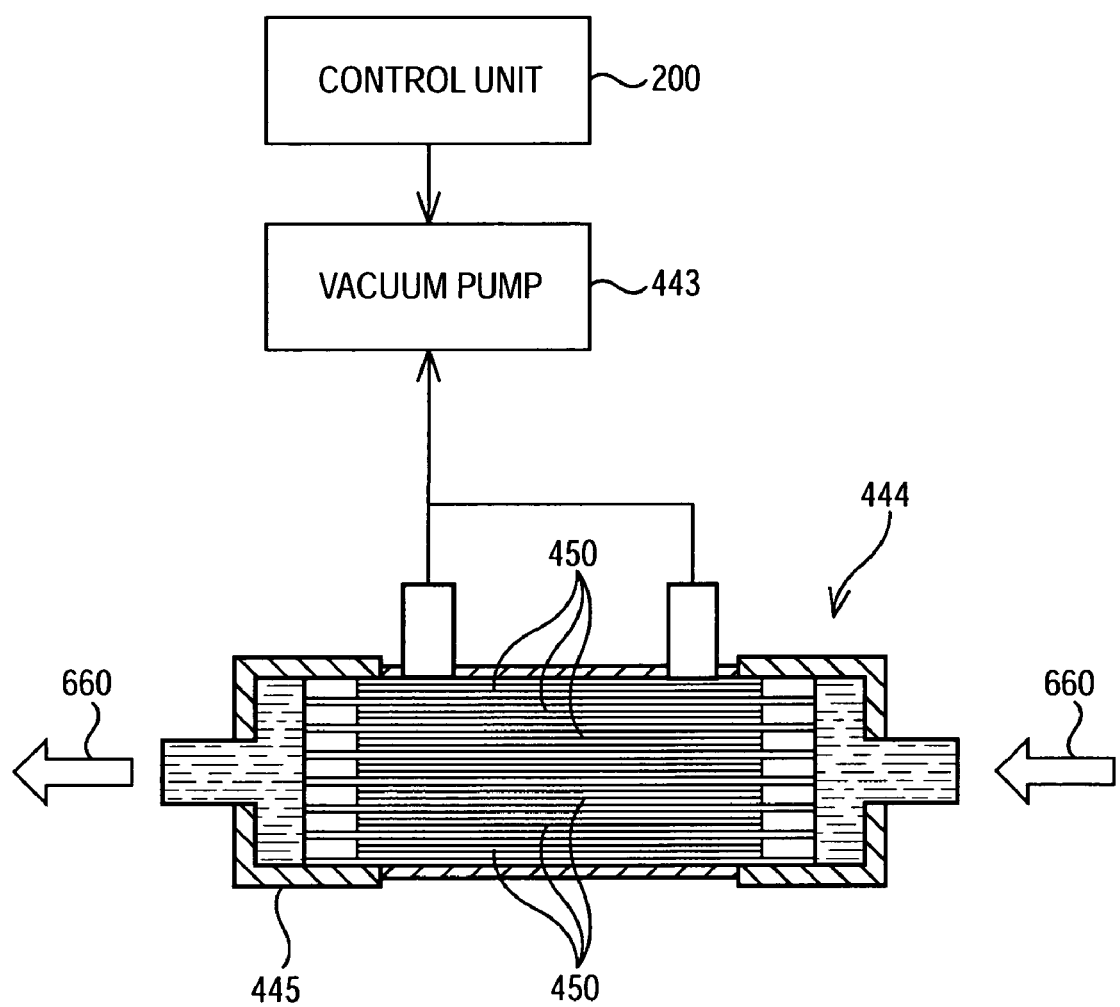

LIQUID DROPLET DISCHARGE APPARATUS, LIQUID SUPPLY DEVICE THEREOF, ELECTRO-OPTICAL DEVICE, AND ELECTRONIC APPARATUS

RELATED APPLICATIONS

This application claims priority to Japanese Patent Application No. 2004-259330 filed Sep. 7, 2004 which is hereby expressly incorporated by reference herein in its entirety.

BACKGROUND OF THE INVENTION

1. Technical Field

The present invention relates to a liquid droplet discharge apparatus that discharges liquid droplets to a work, to a liquid supply device thereof, to an electro-optical device, and to an electronic apparatus.

2. Related Art

Liquid droplet discharge apparatuses have been used as image drawing systems in which liquid droplets are discharged to a work according to an ink-jet method. These image drawing systems have been used in some cases to manufacture electro-optical devices such as flat panel displays.

A liquid droplet discharge apparatus discharging liquid droplets using an inkjet method has a head that discharges liquid droplets and an ink cartridge that supplies liquid to the head. The head may be connected to the ink cartridge by an ink supply tube (for example, see Japanese Unexamined Patent Application Publication No. 61-53052 (page 3 and FIG. 1)). The ink supply tube employs a double tube structure in order to prevent permeation of air or the like. Accordingly, air may be prevented from permeating from the external environment into ink in the tube.

However, such a double structure ink supply tube has the following problems.

An outer tube and an inner tube are intended to capture air permeating from the external environment. However, since the amount of air becomes saturated as the amount of air between the outer tube and the inner tube increases, the air is likely to permeate into the inner tube.

In addition, when the inner tube and the outer tube are bent, the inner circumferential surface of the outer tube rubs against the outer circumferential surface of the inner tube, which results in breakage of the tubes.

SUMMARY

An advantage of the invention is that it provides a liquid droplet discharge apparatus, a liquid supply device thereof, an electro-optical device, and an electronic apparatus, which is capable of preventing gases from the external environment from permeating into the internal liquid by actively deaerating the gases to the outside and preventing a first outer tube from rubbing against a second inner tube when both tubes are bent.

According to a first aspect of the invention, there is provided a liquid droplet discharge apparatus that discharges liquid droplets onto a work. The liquid droplet discharge apparatus includes a liquid container that contains liquid, a head that discharges the liquid droplets, and a liquid supply device disposed between the liquid container and the head that supplies the liquid from the liquid container to the head. The liquid supply device includes a first tube connected between the liquid container and the head that supplies the liquid, a second tube surrounding an outer circumference of the first tube, and a fluid circulating unit that contains deaerating fluid in a space defined between the first tube and the second tube and circulating the deaerating fluid while deaerating gases contained in the deaerating fluid to outside the second tube through the second tube.

With this configuration, the liquid container contains the liquid. The head discharges the liquid droplets. The liquid supply device is disposed between the liquid container and the head and supplies the liquid from the liquid container to the head.

The first tube of the liquid supply device is connected between the liquid container and the head, and supplies the liquid. The second tube surrounds the outer circumference of the first tube. Deaerating fluid is contained in the space defined between the first tube and the second tube. The liquid circulating unit actively circulates the deaerating fluid while deaerating gases contained in the deaerating fluid to outside the second tube through the second tube.

Accordingly, the gases are released from the deaerating fluid contained in the space between the first tube and the second tube to the external environment, thereby preventing permeation of the gases from the outside into the liquid flowing in the first tube.

According to a second aspect of the invention, preferably, the fluid circulating unit includes a sucking unit, a circulating tube connected to the space in which the deaerating fluid is circulated by suction of the sucking unit, and a filter that separate the gases from the circulating deaerating fluid.

With this configuration, the circulating tube of the fluid circulating unit is connected to the space between the first tube and second tube and circulates the deaerating fluid by suction of the sucking unit, and the filter separates the gases from the deaerating fluid.

Accordingly, by the suction of the sucking unit, the gases can be reliably deaerated through the filter while actively circulating the deaerating fluid in the space between the first tube and the second tube.

According to a third aspect of the invention, preferably, a spacers are arranged in the space defined between the first tube and the second tube in order to maintain the space along the longitudinal direction of the first tub and the second tube.

With this configuration, the spacers are arranged in the space defined between the first tube and the second tube. The spacers maintain the space uniformly along the longitudinal direction of the first tube and the second tube.

Accordingly, even when the first tube and the second tube are bent, the space between the first tube and the second tube can be reliably maintained, and, in addition, the problem of rubbing of the first tube against the second tube can be avoided.

According to a fourth aspect of the invention, preferably, the spacers are arranged with a regular separation in the longitudinal direction of the first tube and the second tube.

With this configuration, the spacers are arranged with the regular separation in the longitudinal direction of the first tube and the second tube.

Accordingly, the spacers can reliably maintain the space between the first tube and the second tube uniformly.

According to a fifth aspect of the invention, preferably, the spacers are ring-shaped members fixed between an outer circumferential surface of the first tube and an inner circumferential surface of the second tube. In addition, the spacer includes a circular passage hole for passing the first tube through, and projections for forming a fluid passage of the deaerating fluid between the outer circumferential surface of the first tube and the inner circumferential surface of the second tube.

With this configuration, the spacer is a ring-shaped member fixed between the outer circumferential surface of the first tube and the inner circumferential surface of the second tube. In addition, the spacer includes the passage hole and the protection. The passage hole is a circular hole for passing the first tube through. The projections form the fluid passage of the deaerating fluid between the outer circumferential surface of the first tube and the inner circumferential surface of the second tube.

Accordingly, the deaerating fluid can reliably flow between the first tube and the second tube.

According to a sixth aspect of the invention, preferably, the deaerating fluid is the same liquid as the liquid or a solvent contained in the liquid.

With this configuration, the deaerating fluid is the same liquid as the liquid or solvent contained in the liquid.

Accordingly, since the deaerating fluid is the same liquid as the liquid or solvent contained in the liquid, foreign substance other than the liquid can be prevented from flowing between the first tube and the second tube.

According to a seventh aspect of the invention, there is provided a liquid supply device provided in a liquid droplet discharge apparatus that discharges liquid droplets onto a work. The liquid supply device is disposed between a liquid container and a head that supplies the liquid from the liquid container to the head. The liquid supply device includes a first tube connected between the liquid container and the head that supplies the liquid, a second tube surrounding an outer circumference of the first tube, and a fluid circulating unit that contains deaerating fluid in a space defined between the first tube and the second tube and circulating the deaerating fluid while deaerating gases contained in the deaerating fluid to outside the second tube through the second tube.

Accordingly, the gases are released from the deaerating fluid contained in the space between the first tube and the second tube to the external environment, which prevents gases permeating from the outside into the liquid flowing in the first tube.

According to an eighth aspect of the invention, there is provided an electro-optical device manufactured using a liquid droplet discharge apparatus that discharges liquid droplets from a head onto a work. The liquid supply device is disposed between a liquid container and the head that supplies the liquid from the liquid container to the head. The liquid supply device includes a first tube connected between the liquid container and the head that supplies the liquid, and a second tube surrounding an outer circumference of the first tube that supplies the liquid. The electro-optical device is manufactured by discharging the liquid droplets from the head onto the work by using a fluid circulating unit that contains deaerating fluid in a space defined between the first tube and the second tube and circulating the deaerating fluid while deaerating gases contained in the deaerating fluid to outside the second tube through the second tube.

Accordingly, the gases are released from the deaerating fluid contained in the space between the first tube and the second tube to the external environment, which prevents gases permeating from the outside into the liquid flowing in the first tube.

According to a ninth aspect of the invention, there is provided an electronic apparatus equipped with the electro-optical device according to the eighth aspect of the invention.

BRIEF DESCRIPTION OF THE DRAWINGS

The invention will be described with reference to the accompanying drawings, wherein like numbers reference like elements, and wherein:

FIG. 3 is a front view taken in the direction E in FIG. 2 depicting the carriage, head, and the like;

FIG. 5 is a perspective view illustrating a liquid supply device, liquid packs, nozzles and the like;

FIG. 8 is an enlarged diagram illustrating a filter mechanism and a vacuum pump;

DESCRIPTION OF THE EMBODIMENTS

Hereinafter, preferred embodiments of the invention will be described with reference to the drawings.

Figure 1:
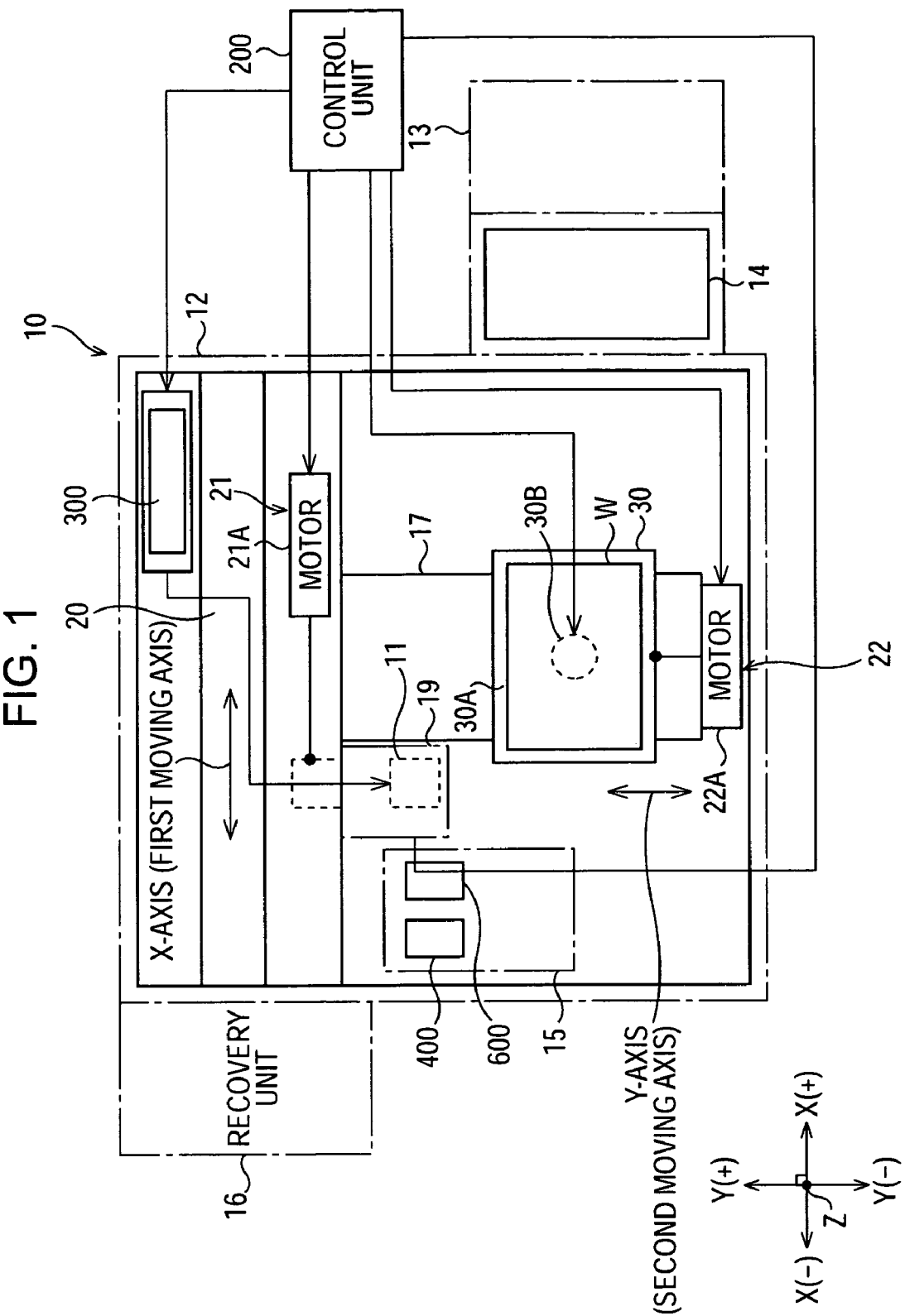
FIG. 1 is a plan view of a liquid droplet discharge apparatus according to a preferred embodiment of the invention.

FIG. 1 is a plan view of a liquid droplet discharge apparatus according to a preferred embodiment of the invention.

A liquid droplet discharge apparatus 10 shown in FIG. 1 can be used as an image drawing system. This image drawing system is incorporated into a production line of, for example, organic EL (electro-luminescence) devices, which are a kind of flat panel display. This liquid droplet discharge apparatus 10, for example, can be used to produce light-emitting elements serving as pixels of the organic EL devices.

The liquid droplet discharge apparatus 10 can be used as an inkjet-type image drawing apparatus, for example. The liquid droplet discharge apparatus 10 is used to produce light-emitting elements of the organic EL devices using a liquid droplet discharge method (inkjet method). A head of the liquid droplet discharge apparatus 10 (also referred to as a functional liquid droplet discharge head) can form the light-emitting elements of the organic EL devices. Specifically, in a production process of the organic EL devices, the liquid droplet discharge apparatus 10 can form a film formation portion in which a hole injection/transport layer and a light emission layer are to be formed in subsequent processes, at positions corresponding to pixel electrodes of a substrate (as an example of a work) on which bank portions are formed through a bank formation process and a plasma process, when the head into which light-emitting material has been introduced scans the substrate.

This embodiment may employ two liquid droplet discharge apparatuses 10, for example, one for forming the hole injection/transport layers and the other for forming the light-emitting layer from which R (red), G (green) and B (blue) color light is emitted.

The liquid droplet discharge apparatus 10 of FIG. 1 is contained in a chamber 12. The chamber 12 has another chamber 13. This chamber 13 contains a work carrying table 14. The work carrying table 14 is a table for carrying a work W in the chamber 12 or carrying a processed work W from a table 30 within the chamber 12.

The chamber 12 shown in FIG. 1 contains a maintenance unit 15 for maintaining a head 11. In addition, a recovery unit 16 is provided outside the chamber 12.

The maintenance unit 15 includes a sucking unit 400, a cleaning unit (wiping unit) 600, a flushing unit (not shown), a discharge checking unit (not shown), a weight measuring unit (not shown), and the like.

The flushing unit is used to contain liquid droplets preliminarily discharged from the head 11. The sucking unit 400 is used to suck liquid or bubbles from nozzles at a nozzle surface of the head 11.

The cleaning unit 600 is also referred to as a wiping unit, which is used to remove contaminants such as liquids and the like adhered to the nozzle surface by means of a cleaning member (wiping member). The discharge checking unit checks the discharge state of the liquid droplets discharged from the head 11. The weight measuring unit measures the weight of the liquid droplets discharged from the head 11.

The recovery unit 16 has, for example, a liquid droplet recovery system for recovering liquid droplets and a cleaning solution supply system that supplies a cleaning solution to be used after removing the contaminants.

The air of the chamber 12 and that of the chamber 13 are managed separately such that atmosphere of the chamber 12 and that of the chamber 13 do not fluctuate. The reason for the separate management of the chamber 12 and the chamber 13 is, for example, that it may prevent any adverse effect resulting from the atmosphere used in the manufacture of organic EL elements unsuited to exposure to water or the like in the atmosphere. Dry air is continuously introduced into and removed from the chamber 12 and the chamber 13 such that a dry air atmosphere is maintained in the chamber 12 and the chamber 13.

Next, components inside the chamber 12 shown in FIG. 1 will be described.

Inside the chamber 12 are contained a frame 20, the head 11, a carriage 19, a liquid storing unit 300, a first operating unit 21, a second operating unit 22, a table 30, and a guide base 17.

The frame 20 shown in FIG. 1 is horizontally positioned along an X-axis direction. The guide base 17 is positioned along a Y-axis direction. The frame 20 is located upward of the guide base 17. The X-axis corresponds to a first shifting axis and the Y-axis corresponds to a second shifting axis. The X-axis is perpendicular to a Z-axis as well as the Y-axis. The Z-axis is perpendicular to a plane of FIG. 1.

The first operating unit 21 is used to linearly reciprocate and position the carriage 19 and the head 11 along the frame 20 in the X-axis direction.

The second operating unit 22 has the table 30. The table 30 can load the work W shown in FIG. 1 in a detachable manner. The table 30 of the second operating unit 22 supports the work W when liquid droplets are applied from the head 11 to the work W. The second operating unit 22 can linearly move and position the work W above the guide base 17 along the Y-axis direction.

The first operating unit 21 has a motor 21A for linearly moving and positioning the carriage 19 and the head 11 in the X-axis direction. The motor 21A can linearly move the carriage 19 and the head 11 in the X-axis direction by using, for example, a feed screw. The motor 21A may be a rotating electric motor or a linear motor.

A motor 22A of the second operating unit 22 can linearly move and position the table 30 along the guide base 17 in the Y-axis direction. The motor 22A may be, for example, a rotating electric motor rotating the feed screw. Alternatively, the motor 22A may be a linear motor instead of the rotating motor.

The table 30 of the second operating unit 22 has a loading surface 30A. The loading surface 30A is a surface perpendicular to the Z-axis direction in FIG. 1. The loading surface 30A has an absorbing portion 30B. The absorbing portion 30B serves to absorb the work W using a vacuum absorption method. Thus, the work W can be reliably fixed, without deviating from the loading surface 30A, in a detachable manner.

Next, an exemplary structure of the carriage 19 and the head 11 will be described with reference to FIGS. 2 and 3.

Figure 2:
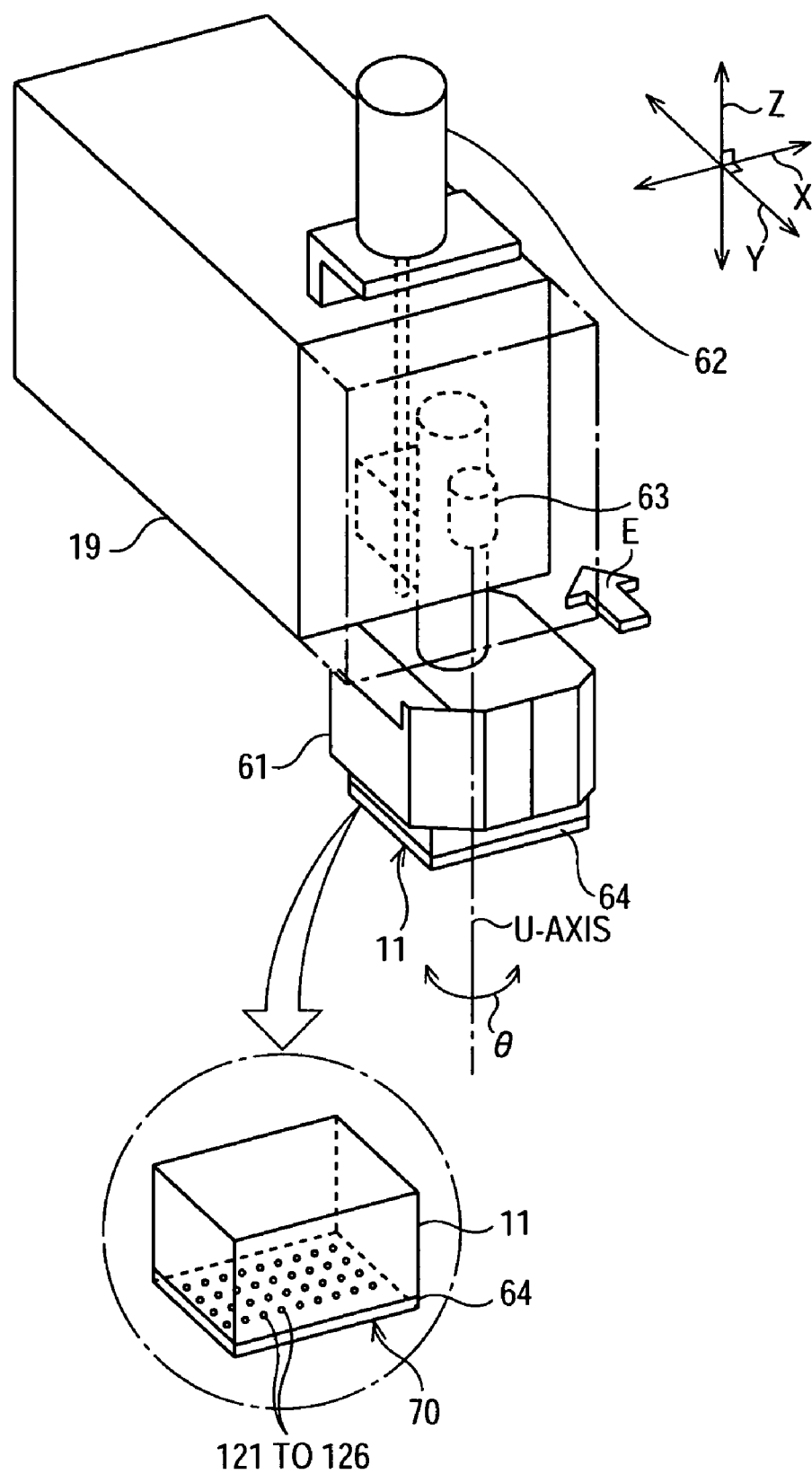
FIG. 2 is a perspective view illustrating a carriage, a head, and the like of the liquid droplet discharge apparatus shown in FIG. 1.
Figure 3:
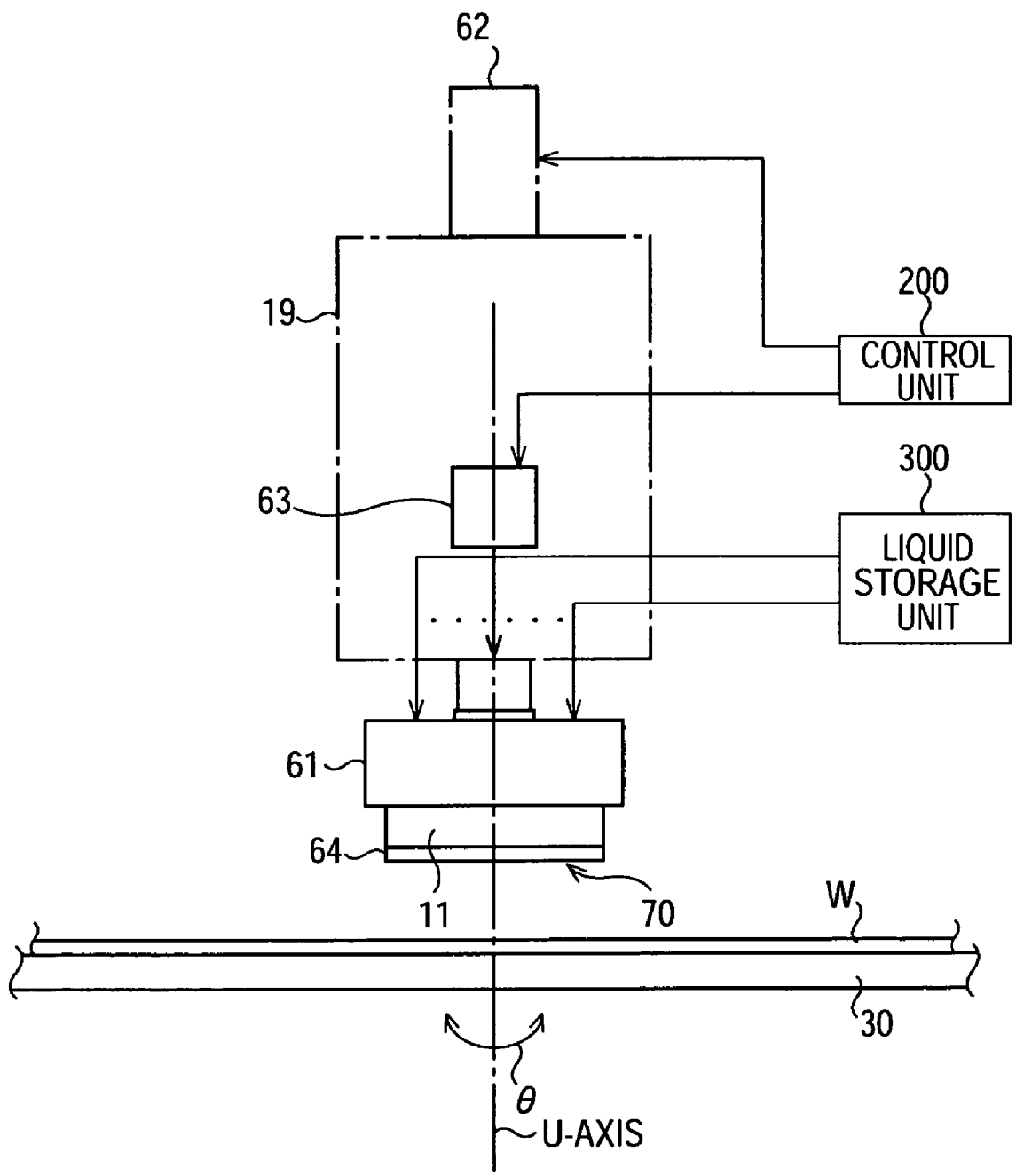

FIG. 2 is a perspective view illustrating an example of the carriage 19, the head 11, and their exteriors, and FIG. 3 is a front view taken in direction E in FIG. 2.

The carriage 19 can be moved and positioned in the X-axis direction by the motor 21A shown in FIG. 1. The carriage 19 supports the head 11 in a detachable manner using a head holder 61.

As shown in FIG. 3, when a motor 62 is driven by a command from a control unit 200, the unit of the head holder 61 and the head 11 can be vertically moved and positioned along the Z-axis direction. In addition, when another motor 63 is driven by a command from a control unit 200, the head 11 can be rotated in a θ direction around a U axis.

As shown in FIGS. 2 and 3, the head 11 has a nozzle plate 64. The bottom of the nozzle plate 64 is a nozzle surface 70. The nozzle surface 70 has nozzle openings 121 to 126 of a plurality of nozzles. The head 11 is connected to the liquid storing unit 300. The liquid storing unit 300 serves to store liquid to be discharged onto the work W and is also referred to as a functional solution storing unit. The liquid stored in the liquid storing unit 300 can be discharged from the nozzle openings 121 to 126 according to an inkjet method, for example by actuation of a piezoelectric vibrator 789 shown in FIG. 4A.

Figure 4A:
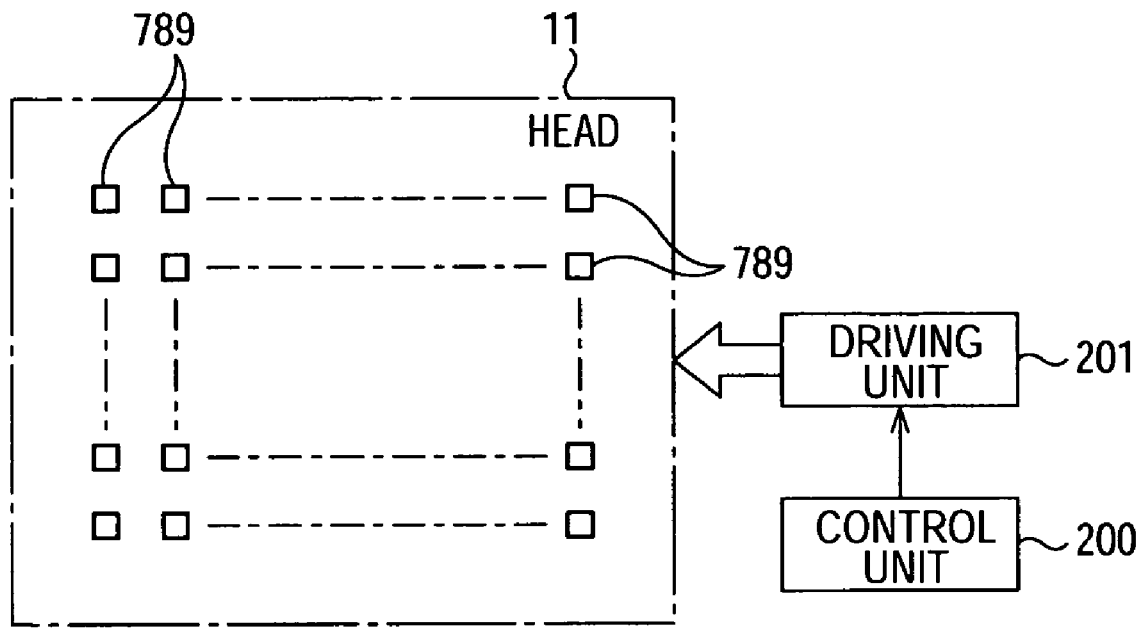
FIG. 4 is a diagram illustrating an exemplary piezoelectric vibrator of the head and an exemplary structure of a liquid storing unit.

FIG. 4A shows an example of a plurality of piezoelectric vibrators 789 disposed within the head 11. These piezoelectric vibrators 789 correspond to the nozzles of the head 11 shown in FIG. 2. When the control unit 200, shown in FIG. 4A applies a signal to a driving unit 201, the driving unit 201 drives any of the plurality of piezoelectric vibrators 789, and accordingly, liquid droplets are discharged in an inkjet manner from a nozzle opening 121 to 126 (shown in FIG. 2) of a nozzle corresponding to the driven piezoelectric vibrator 789.

Next, the liquid storing unit 300 will be described with reference to FIGS. 4B, 5, and 6.

Figure 4B:
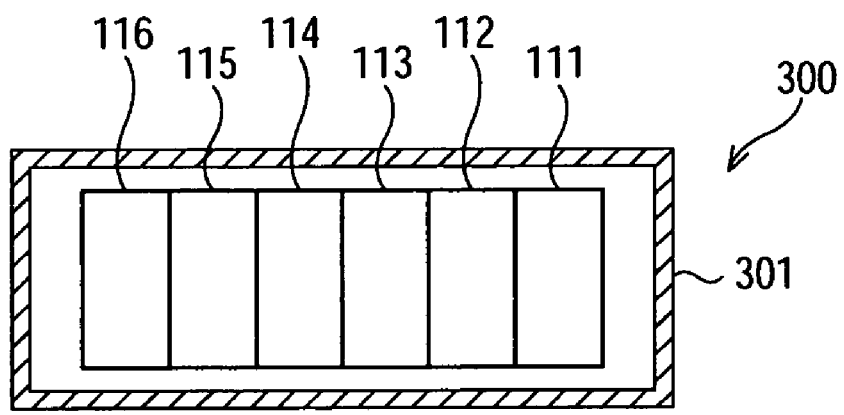

The liquid storing unit 300 has a plurality of liquid packs 111 to 116 and a container 301 containing these liquid packs, for example, as shown in FIG. 4B. Although six liquid packs 111 to 116 are shown in this embodiment, the number of liquid packs may be one, or two to five, or more than seven, without any limitation.

The liquid packs 111 to 116, each of which is made of a flexible material, contain the same or different kinds of liquid. As compressed air is introduced from the outside into the container 301, the liquid packs 111 to 116 are compressed, and accordingly, each of the liquid packs 111 to 116 discharges liquid.

Figure 5:
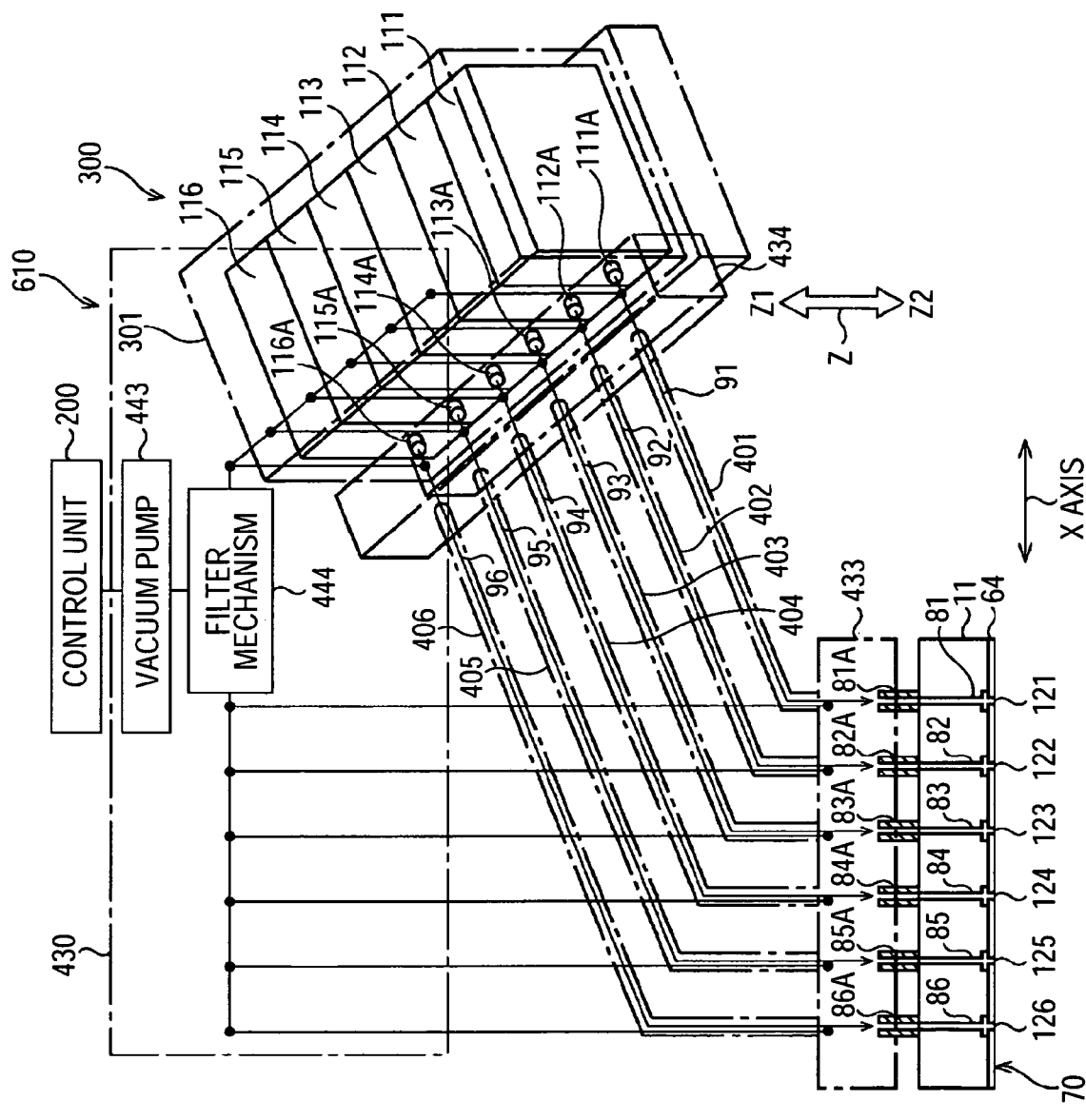

The liquid packs 111 to 116 shown in FIG. 5 are detachably connected to corresponding nozzles 81 to 86 of the head 11 by first tubes 91 to 96, respectively.

One end of the first tube 91 is detachably connected to a connector 111A of the liquid pack 111. The other end of the first tube 91 is detachably connected to a connector 81A of the head 11.

Similarly, one of the ends of each of the first tubes 92 to 96 is detachably connected to the corresponding one of connectors 112A to 116A of the liquid packs 112 to 116, respectively. The other ends of the first tubes 92 to 96 are detachably connected to connectors 82A to 86A of the head 11, respectively.

As shown in FIG. 5, the head 11 has the plurality of nozzles 81 to 86. The nozzles 81 to 86 have nozzle openings 121 to 126, respectively. For example, several tens or several thousands of nozzles 81 can be arranged along a direction perpendicular to a plane of FIG. 5, forming a line of nozzles. Similarly, other nozzles 82 to 86 form a line of nozzles, respectively, along the direction perpendicular to the plane of FIG. 5. The nozzle openings 121 to 126 are formed facing the nozzle surface 70 of the nozzle plate 64.

The nozzle surface 70 is directed to a downward direction Z2 of the Z-axis in FIG. 5. For example, six lines of the nozzles (lines of nozzle openings) are arranged on the nozzle surface 70 in the direction perpendicular to the plane of FIG. 5.

FIG. 5 shows an exemplary structure of a liquid supply device 610 of the liquid droplet discharge apparatus, in addition to the head 11 and the liquid-storing unit 300.

The liquid supply device 610 has the first tubes 91 to 96, second tubes 401 to 406, and a fluid circulating unit 430.

The fluid circulating unit 430 actively circulates deaerating fluid contained in spaces defined between the first tubes 91 to 96 and the second tubes 401 to 406 corresponding to the first tubes 91 to 96, releasing air from the deaerating fluid outside the second tubes.

Figure 6:
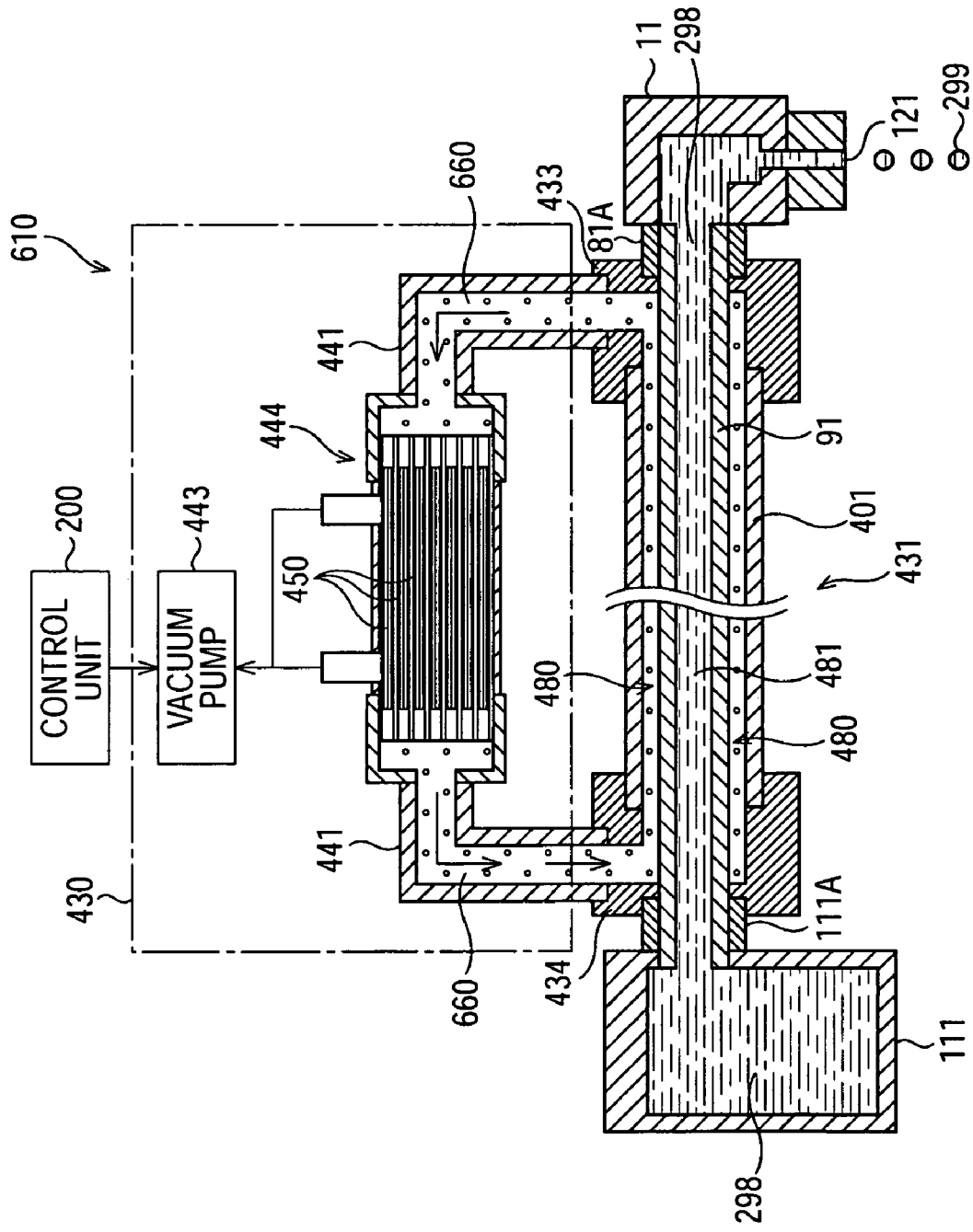
FIG. 6 is a diagram illustrating a liquid circulating unit, a first tube, a second tube, and the like in the liquid supply device.

FIG. 6 shows an exemplary structure of a double structure 431 of the first tube 91 and the second tube 401, the fluid circulating unit 430, the head 11 and the liquid pack 111 in the liquid supply device 610.

The exemplary structure shown in FIG. 6 is the same as the double structure of the first tube 92 and the second tube 402, the double structure of the first tube 93 and the second tube 403, the double structure of the first tube 94 and the second tube 404, the double structure of the first tube 95 and the second tube 405, and the double structure of the first tube 96 and the second tube 406, which are shown in FIG. 5.

Thus, the double structure 431 of the first tube 91 and the second tube 401 is representatively shown in FIG. 6 and its structure and operation will be representatively described.

The connector 81A of the head 11 shown in FIG. 6 is connected to one end of the first tube 91. The other end of the first tube 91 is connected to the connector 111A of the liquid pack 111. The liquid pack may be also called an ink tank or an ink pack.

A block 433 shown in FIG. 6 is fixed by being connected to the connector 81A. Another block 434 is fixed by being connected to the connector 111A of the liquid pack 111. One end of the first tube 91 passes through the block 433, while the other end of the first tube 91 passes through the block 434.

Both the first tube 91 and the second tube 401 are made of a flexible material such as nylon and have different inner diameters in a longitudinal direction. The inner diameter of the second tube 401 is larger than the outer diameter of the first tube 91. At the outer side of an outer circumferential surface of the first tube 91, the second tube 401 is arranged in a coaxial form with respect to the first tube 91. One end of the second tube 401 is connected and fixed to the block 433, while the other end of the second tube 401 is connected and fixed to the block 434.

Figure 7A:
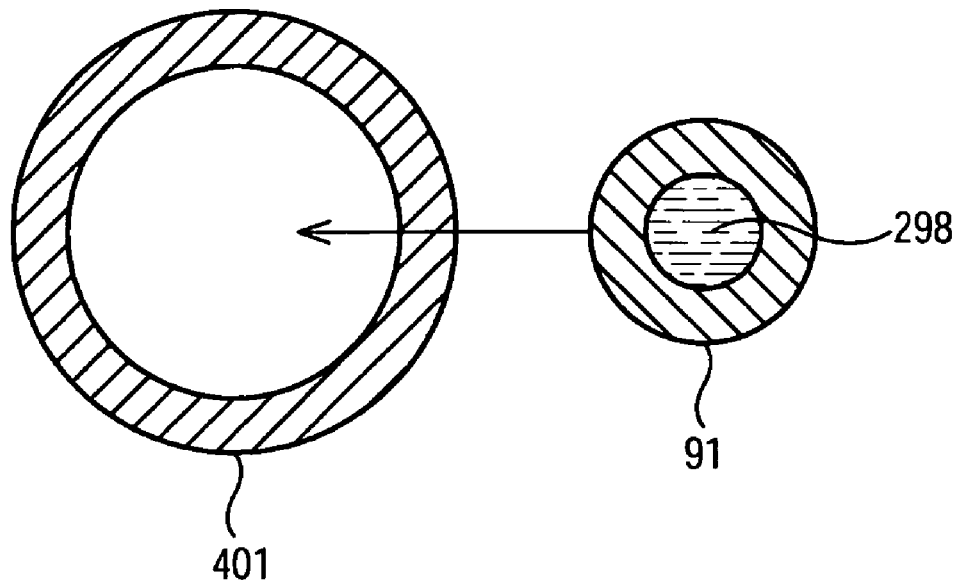
FIG. 7 is a sectional view illustrating an exemplary structure of the first and second tubes.
Figure 7B:
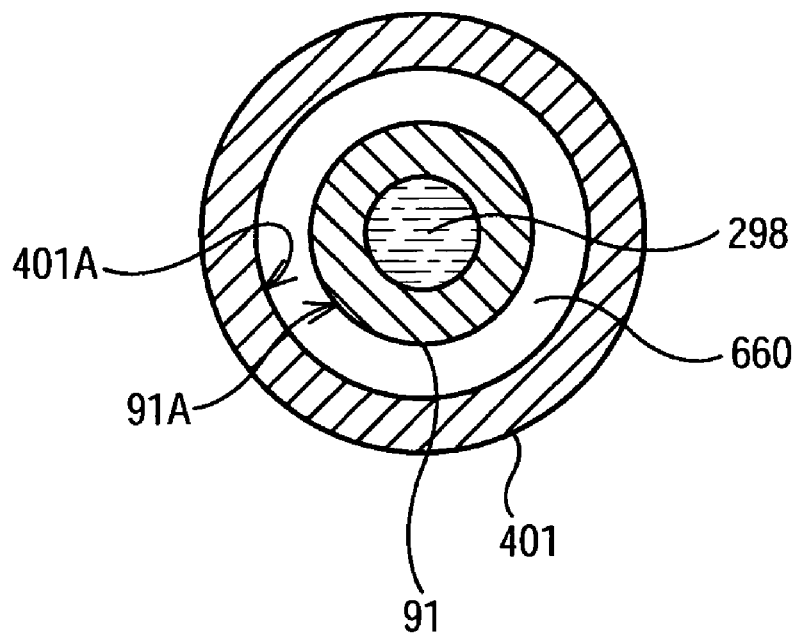

FIG. 7A shows exemplary sectional structures of the first tube 91 and the second tube 401. The first tube 91 lies within the second tube 401 in a coaxial form, as shown in FIG. 7B. The outer circumferential surface 91A of the first tube 91 faces the inner circumferential surface 401A of the second tube 401. Coating ink 298 passes through the first tube 91. Deaerating fluid 660 passes between the outer circumferential surface 91A of the first tube 91 and the inner circumferential surface 401A of the second tube 401. In order to prevent air from being permeated into the coating ink 298 from the external environment, the fluid circulating unit 430 actively circulates the deaerating fluid 660 containing air while removing the air contained in the deaerating fluid 660.

The deaerating fluid 660 may include image drawing or coating ink 298, as it is, or a solvent contained in the ink 298. For example, xylene, acetone, decane, butylcatbitolacetate (BCTAC) and the like may be used as the solvent.

In this way, when the ink 298 itself or a solvent contained in the ink is used as the deaerating fluid 660, it may prevent other foreign substances from passing between the outer circumferential surface 91A and the inner circumferential surface 401A. In addition, since material being currently used is reused, costs can be reduced.

Next, a structure of the fluid circulating unit 430 shown in FIGS. 5 and 6 will be described.

As shown in FIG. 6, the fluid circulating unit 430 has a circulating tube 441, a vacuum pump 443 as a sucking unit, and a filter mechanism 444.

One end of the circulating tube 441 is connected and fixed to the block 433. The filter mechanism 444 is arranged in series in the course of the circulating tube 441. The other end of the circulating tube 441 is connected and fixed to the block 434. The circulating tube 441 is made of, for example, a flexible material.

One end of the circulating tube 441 is connected in series to a space defined between the first tube 91 and the second tube 401 via the block 433. Similarly, the other end of the circulating tube 441 is connected in series to the space defined between the first tube 91 and the second tube 401 via the block 434.

Thus, a fluid passage of the circulating tube 441 and a fluid passage of the space defined between the first tube 91 and the second tube 401 form a circulating path of the deaerating fluid 660.

The filter mechanism 444 shown in FIGS. 8 and 6 has a case 445 and a plurality of filters 450. The filters 450 are arranged in parallel with a flow direction of the deaerating fluid. The case 445 seals the filters 450 and the deaerating fluid 660 flowing through the circulating tube 441 passes through the case 445.

When the vacuum pump 443 connected to the case 445 is actuated by a command from the control unit 200, it is possible to exhaust air as functional film permeating gas, which is gas dissolved in the deaerating fluid 660, from the filter mechanism 444 to the external environment.

A set of the filter mechanism 444 and the circulating tube 441 may be provided commonly to the double structures including the first tubes 91 to 96 and the second tubes 401 to 406, for example, as shown in FIG. 5.

However, without any limitation, the fluid circulating unit 430 may be separately provided to the double structures of the first tubes 91 to 96 and the second tubes 401 to 406.

Figure 9:
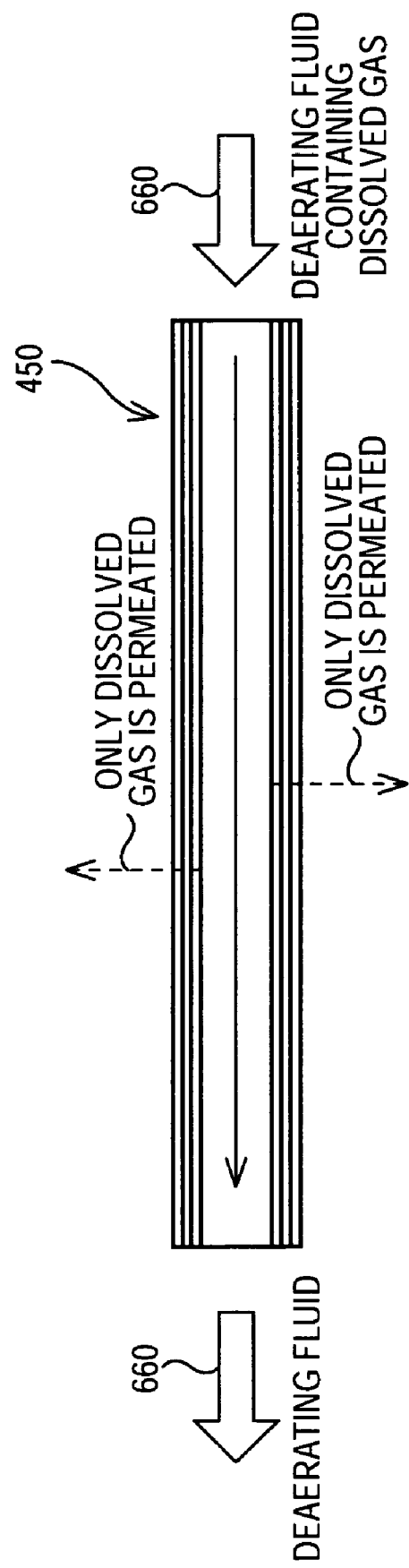
FIG. 9 is a diagram explaining an example, in principle, of removing dissolved gases from deaerating fluid using a filter.

FIG. 8 is an enlarged diagram illustrating the filter mechanism 444, the vacuum pump 443 and the like. At least one filter 450 may be arranged, or preferably, a plurality of filters 450 may be arranged in parallel. The filters 450 are filters made of, for example, hollow fiber permeating only dissolved gases from the deaerating fluid 660 containing the dissolved gases. FIG. 9 shows that a filter 450 made of the hollow fiber permeates only dissolved gases from the deaerating fluid 660 containing the dissolved gases to outside of the filters 450.

Only dissolved gases are deaerated from the deaerating fluid 660 by suction of the vacuum pump 443.

By actuation of the vacuum pump 443, in the course of the fluid passage of the circulating tube 441, the fluid passage of the space defined between the second tube 401 and the first tube 91, and the fluid passage of the filter mechanism 444, the deaerating fluid 660 can be forcibly circulated along, for example, a counterclockwise direction in FIG. 6.

Accordingly, the deaerating fluid 660 can be forcibly circulated and only the dissolved gases contained in the deaerating fluid 660 can be deaerated to the external environment.

Figure 10:
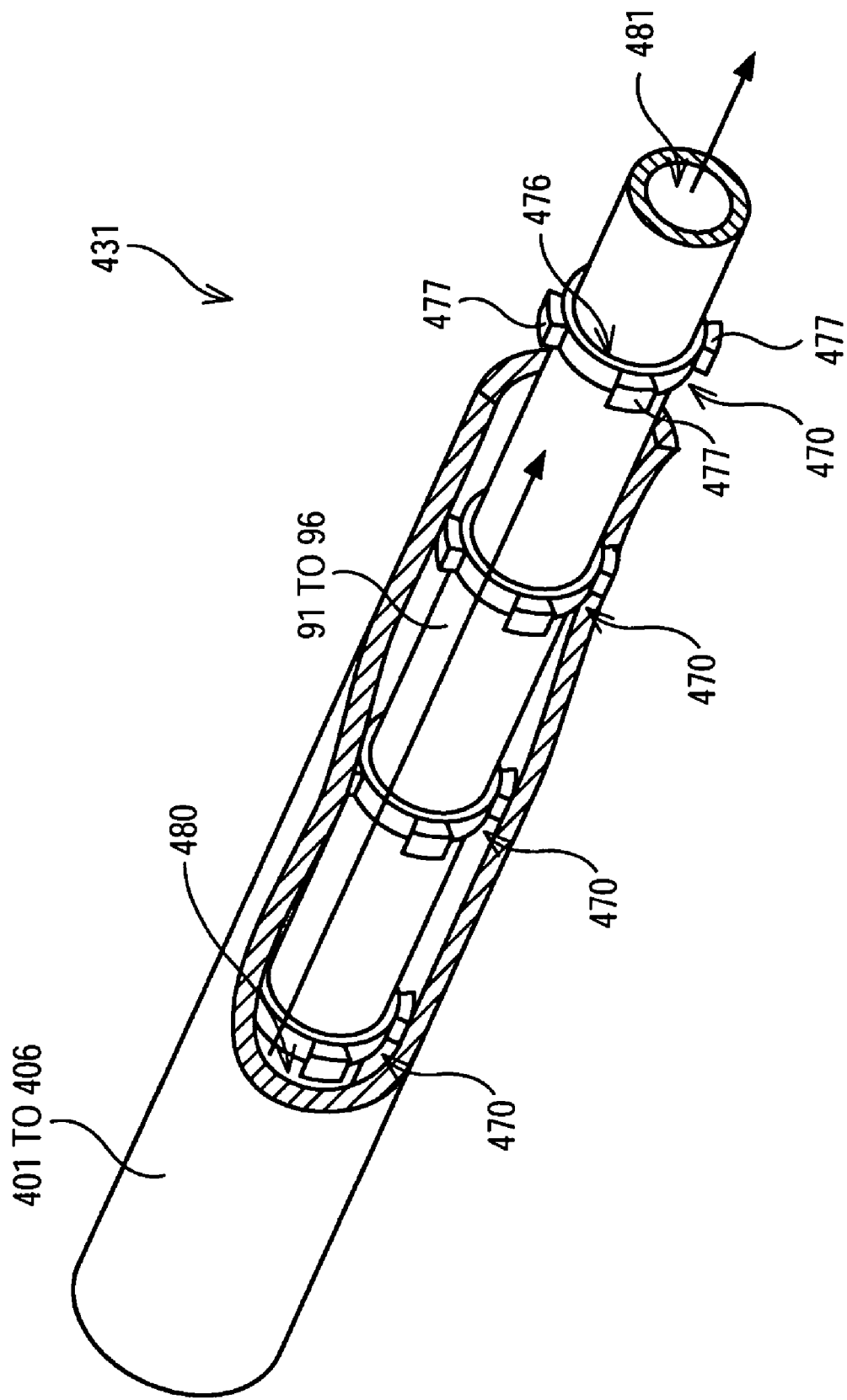
FIG. 10 is a partial cutout perspective view illustrating an example of the first tube, the second tube, and spacers.
Figure 11:
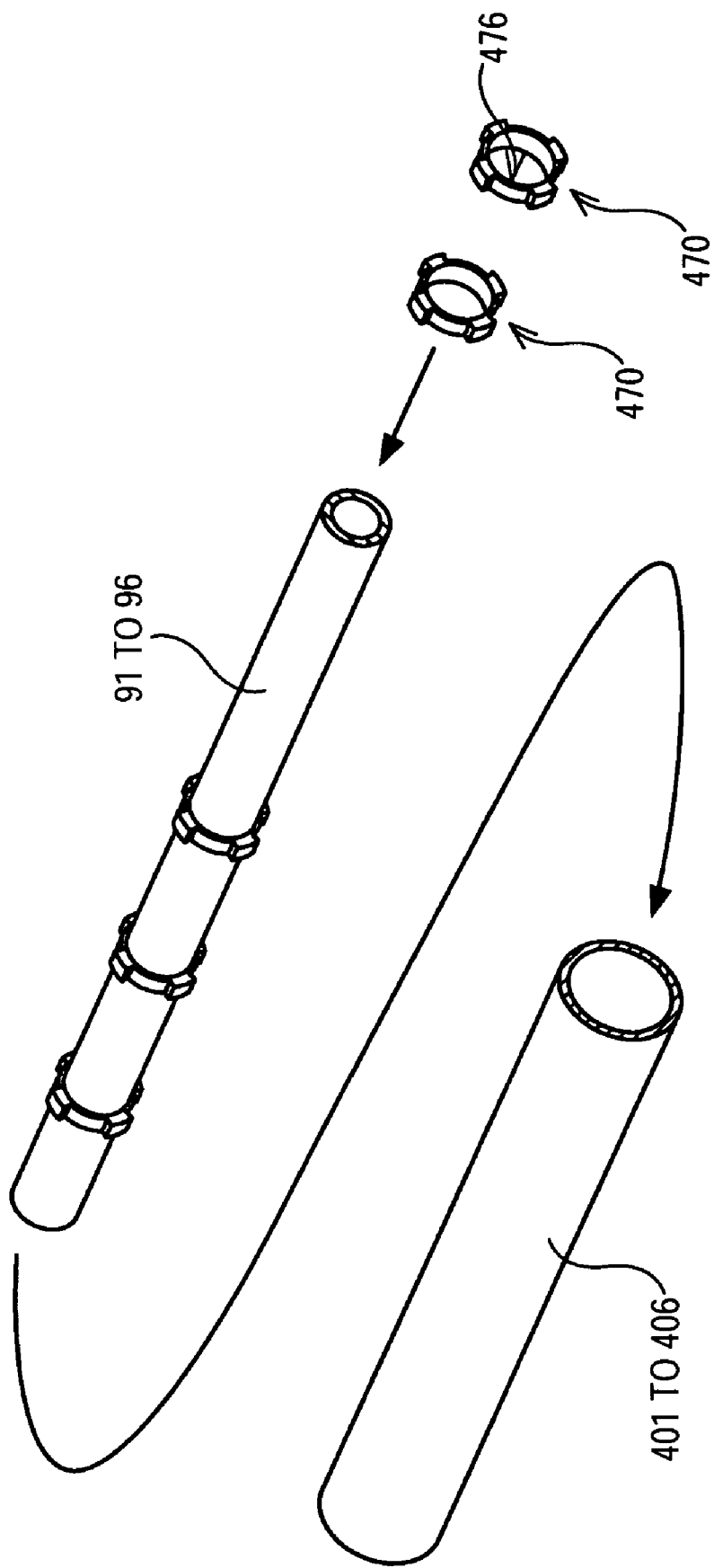
FIG. 11 is an exploded perspective view illustrating the first tube, the second tube, and the spacers.

FIGS. 10 and 11 show an exemplary structure of the double structures 431 of the first tubes 91 to 96 and the second tubes 401 to 406. The first tubes 91 to 96 and the second tubes 401 to 406 are arranged in a coaxial form, as described above, such that a fluid passage 480 with a specific space can be maintained by a plurality of spacers 470.

The spacers 470 are preferably arranged with the same separation along a longitudinal direction of the first tube. Accordingly, even when the first tube and the second tube are bent, the first tube does not rub against the second tube, a space between the first tube and the second tube can be reliably maintained along the longitudinal direction, and the fluid passage 480 of the deaerating fluid 660 can be reliably and uniformly maintained.

Figure 12:
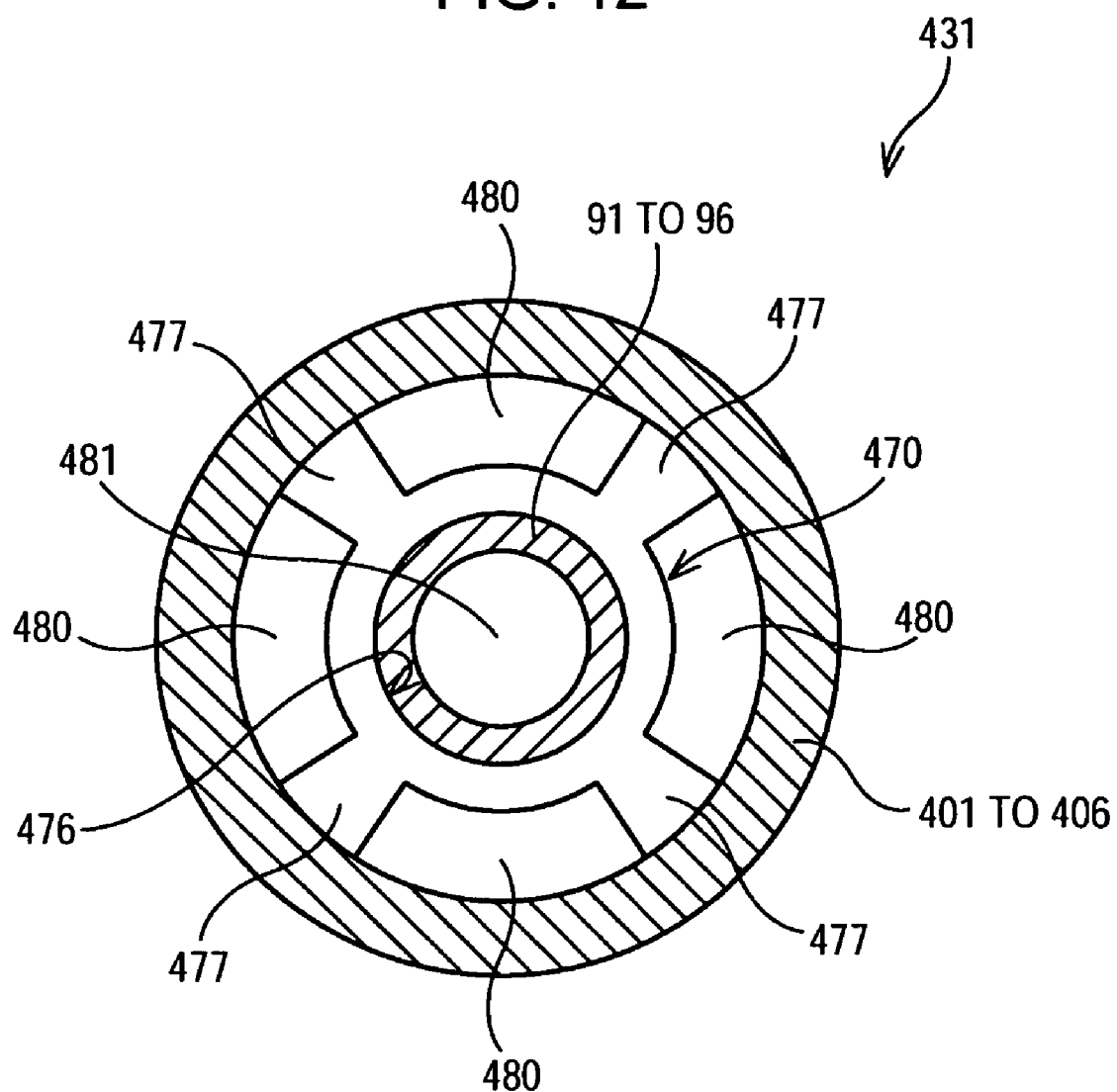
FIG. 12 is a sectional view illustrating the first tube, the second tube, and the spacer.

FIG. 11 is an exploded perspective view illustrating the spacers 470, the first tubes 91 to 96, and the second tubes 401 to 406. FIG. 12 shows an exemplary structure of the spacers 470.

Each of the spacers 470 has a circular passage hole 476 and a plurality of protections 477. In the shown example, four protections 477 are formed with a 90° separation in a radial direction. The outer circumferential surfaces of the first tubes 91 to 96 pass through the circular passage hole 476. A leading edge of the protections 477 supports the inner circumferential surfaces of the second tubes 401 to 406.

Thus, the first tubes 91 to 96 can reliably maintain the fluid passage 480 between the first tube and the second tube. In addition, even when the first tube and the second tube are bent, the shape of the fluid passage 480 between the first tube and the second tube as well as the shape of the fluid passage 481 of the first tube can be maintained. Accordingly, it is possible to ensure good flow of the deaerating fluid as well as good flow of the coating ink.

The first tubes 91 to 96 may also be called inner tubes and the second tubes 401 to 406 may also be called outer tubes. The spacers 470 may also be called fluid passage notch rings.

Next, an exemplary operation of the liquid supply device 610 will be described with reference to FIG. 6.

The ink 298 is supplied from the liquid pack 111 shown in FIG. 6 to the head 11 through the first tube 91. The head 11 discharges the ink 298 as ink droplets 299 from the nozzle openings 121 to 126.

In this case, while the ink 298 flows into the fluid passage 481 of the first tube 91, air permeates into the deaerating fluid 660 from the external environment through the second tube 401 with respect to the ink 298.

This air is trapped by the deaerating fluid 660 and is actively circulated in the counterclockwise direction in FIG. 6 through the fluid passage 480 between the first tube 91 and the second tube 401, and the fluid passage of the circulating tube 441 by the actuation of the vacuum pump 443. As the deaerating fluid 660 flowing through the circulating tube 441 passes through the filters 450 of the filter mechanism 440, the dissolved gases contained in the deaerating fluid 660 can be deaerated as the functional film permeating gases by suction of the vacuum pump 443 to the external environment.

Accordingly, the air from the external environment does not permeate into the first tube 91, but is always trapped and circulated by the deaerating fluid 660 flowing through the fluid passage 480 between the first tube 91 and the second tube 401, thereby actively forcing the air to be deaerated to the outside. Accordingly, air can be prevented from being mixed into the ink flowing through the fluid passage 481.

In addition, the pressure of the circulated deaerating fluid 660 can be properly adjusted by adjusting the suction force of the vacuum pump 443 shown in FIG. 6, through a command from the control unit 200. With pressure adjustment, the pressure of the ink 298 can also be controlled.

In addition, since the first tube 91 and the second tube 401 are preferably flexible, the first tube 91 and the second tube 401 may be bent when the head 11 is moved. In this case, the spacers 470 shown in FIGS. 10 to 12 can preferably maintain regular separations such that shapes of the fluid passage 480 and the fluid passage 481 are not varied. In addition, since problems such as rubbing of the outer circumferential surface of the first tube against the inner circumferential surface of the second tube can be avoided, damage is prevented to the first tube and the second tube even when the head is repeatedly moved.

In this manner, the ink can be supplied from the ink packs 111 to 116 to corresponding nozzle openings, and the work W shown in FIG. 1 manufactured by the liquid droplet discharge apparatus 10 of the invention for performing such an ink supply operation can increase the precision in manufacturing and improve the quality of the electro-optical devices. As a result, the quality of electronic apparatuses equipped with these electro-optical devices can be further improved.

This embodiment of the liquid droplet discharge apparatus of the invention can be used to manufacture electro-optical devices. The electro-optical devices may include liquid crystal display devices, organic EL (electro-luminescence) devices, electron emitting devices, PDP (plasma display panel) devices, electrophoresis display devices and the like. The electron emitting devices may include FED (field emission display) devices. Further, the electro-optical devices may include various devices manufactured through processes for forming metal wiring lines, lenses, resists, optical diffusers and the like.

Figure 13:
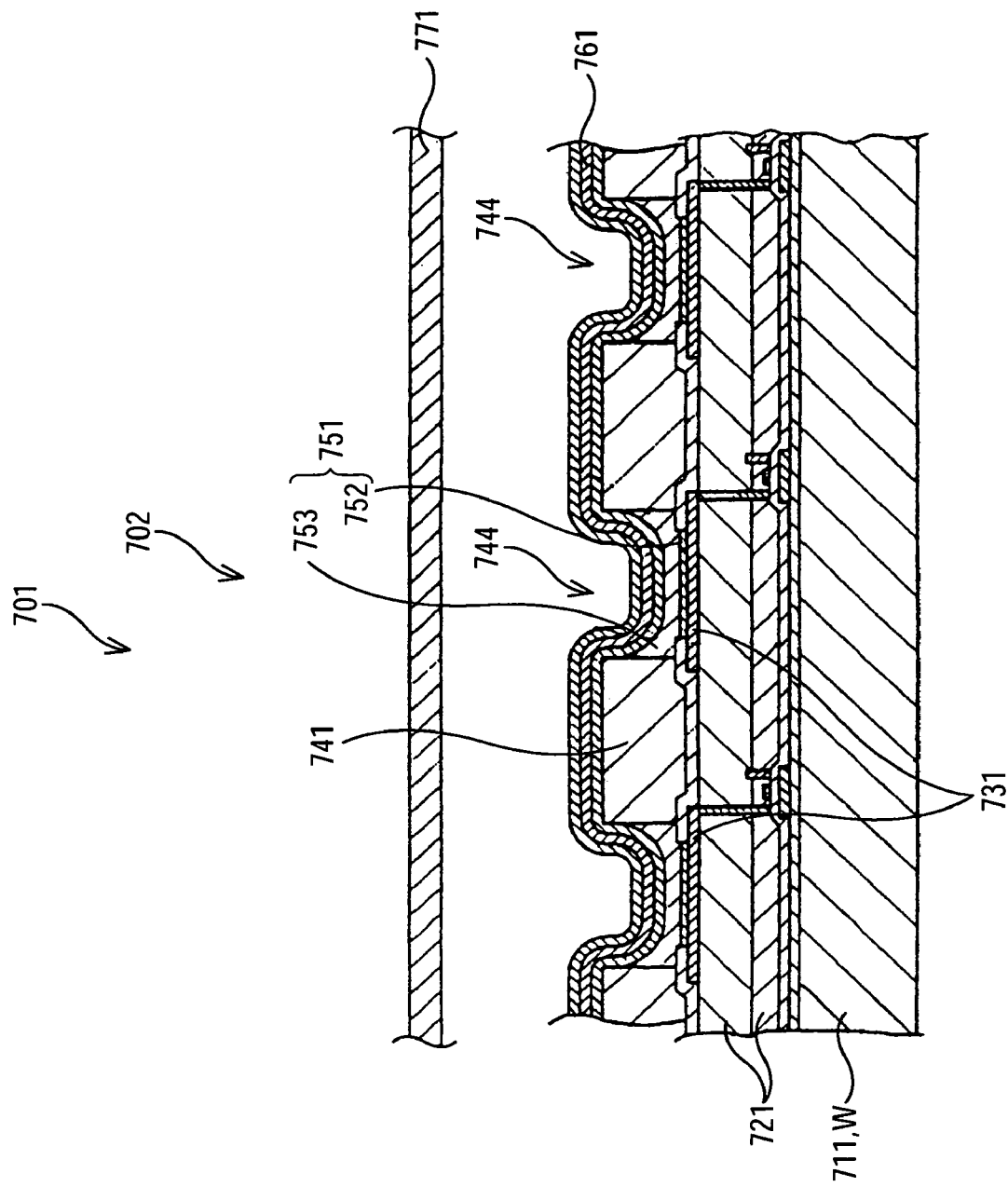
FIG. 13 is a sectional view illustrating an exemplary shape of an organic EL device manufactured by the liquid droplet discharge apparatus of the invention.

FIG. 13 shows an exemplary structure of an organic EL device, which is a kind of flat panel display, when the liquid droplet discharge apparatus of the invention is used as an image drawing apparatus in manufacturing the organic EL device. An organic EL device 701 is constructed by connecting wiring lines of a flexible substrate (not shown) and a driving IC (not shown) to an organic EL element 702, which includes a substrate 711, a circuit element portion 721, pixel electrodes 731, bank units 741, light-emitting elements 751, a cathode 761 (counter electrode), and a sealing substrate 771.

The circuit element portion 721 is formed on the substrate 711 of the organic EL element 702 and a plurality of pixel electrodes 731 are arranged on the circuit element portion 721. In addition, the bank units 741 are formed in a lattice shape between the pixel electrodes 731, and the light-emitting elements 751 are formed in concave openings 744 caused by the bank units 741. The cathode 761 is formed on the entire surface of the bank units and the light-emitting elements 751, and the sealing substrate 771 is laminated on the cathode 761.

A manufacturing process of the organic EL element 702 includes a bank unit formation process for forming the bank units 741, a plasma process properly performed in preparation for later formation of the light-emitting elements 751, a light-emitting element formation process for forming the light-emitting elements 751, a counter electrode formation process for forming the cathode 761, and a sealing process for performing sealing by laminating the sealing substrate 771 on the cathode 761.

That is, the organic EL element 702 is manufactured by forming the bank units 741 at specified positions on the substrate 711 (work W) on which the circuit element portion 721 and the pixel electrodes 731 are formed in advance, performing the plasma process on the resultant structure, forming the light-emitting elements 751 and the cathode 761 (counter electrode), and sealing the cathode 761 by laminating the sealing substrate 771 on the cathode 761. In addition, since the organic EL elements 702 are likely to be deteriorated if they are exposed to water in the atmosphere, it is preferable to manufacture the organic EL elements 702 under dry air or inert gas (nitrogen, argon, helium or the like) atmosphere.

In addition, each light-emitting element 751 is formed by a film formation portion consisting of a hole injecting/transporting layer 752 and a light-emitting layer 753 colored with one of R (red), G (green) and B (blue) colors. The light-emitting element formation process includes a hole injecting/transporting layer formation process for forming the hole injecting/transporting layer 752 and a light-emitting layer formation process for forming the light-emitting layers 753 colored with three colors.

The organic EL device 701 is manufactured by manufacturing the organic EL elements 702, and by connecting the wiring lines of the flexible substrate to the cathode 761 of the organic EL elements 702 and simultaneously connecting wiring lines of the circuit element portion 721 to the driving IC.

Next, an application of the liquid droplet discharge apparatus 10 according to this embodiment of the invention to a liquid crystal display device will be described.

Figure 14:
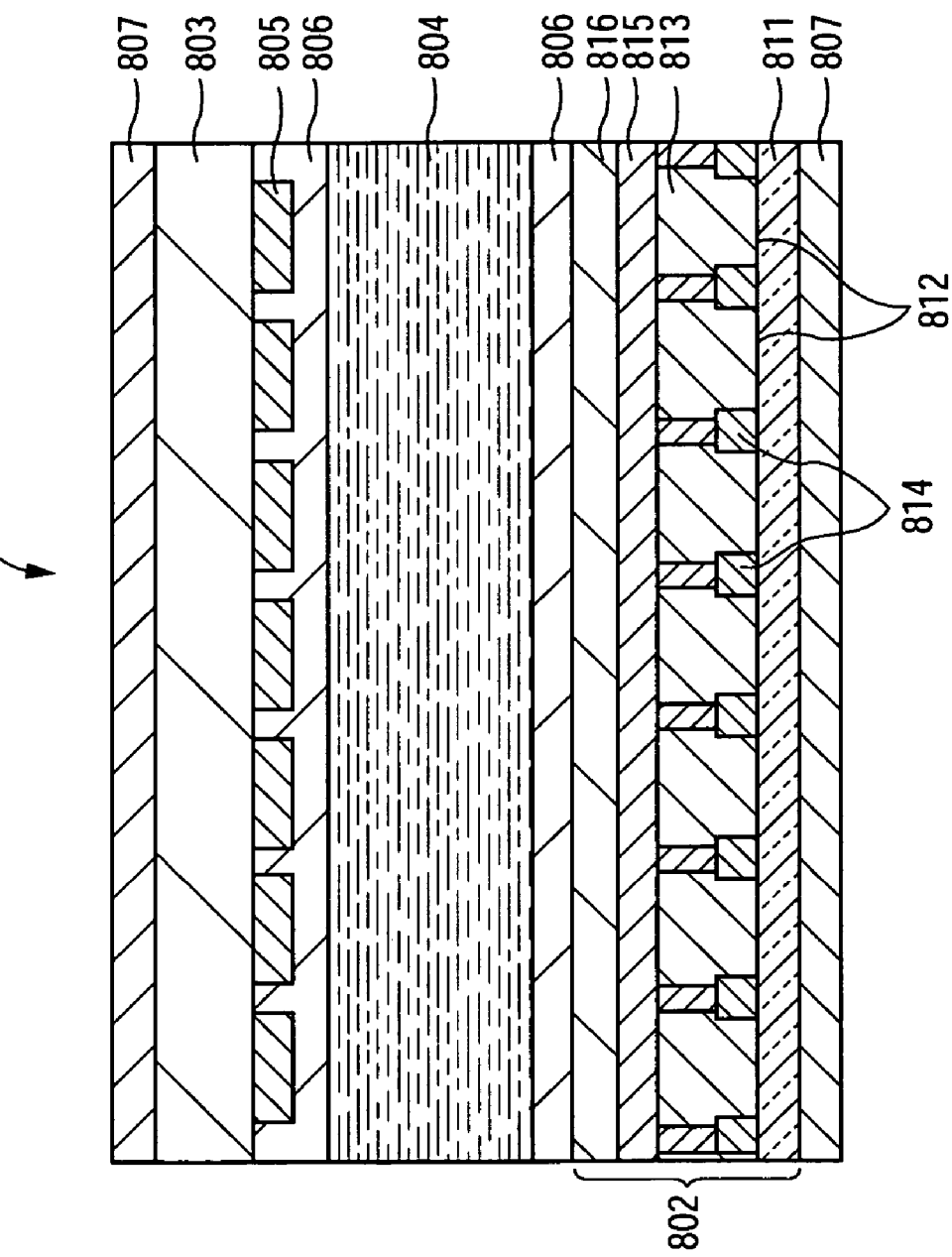
FIG. 14 is a sectional view illustrating an exemplary structure of a liquid crystal display device manufactured by the liquid droplet discharge apparatus of the invention.

FIG. 14 is a sectional view illustrating a liquid crystal display device 801. The liquid crystal display device 801 includes a color filter 802, a counter substrate 803, liquid crystal composition 804 sealed between the color filter 802 and the counter substrate 803, and a backlight (not shown). Pixel electrodes 805 and TFT (thin film transistor) elements (not shown) are formed in a matrix on an inner surface of the counter substrate 803. Red, green and blue colored layers 813 of the color filter 802 are arranged at positions opposing the pixel electrodes 805. Alignment films 806 for aligning liquid crystal molecules in a specified direction are formed on inner surfaces of the color filter 802 and the counter substrate 803, respectively, and polarizing plates 807 are bonded to outer surfaces of the color filter 802 and the counter substrate 803, respectively.

The color filter 802 includes a light transmissive transparent substrate 811, a plurality of pixels (filter elements) 812 formed in a matrix on the transparent substrate 811, the colored layers 813 formed on the pixels 812, and light shielding partitions 814 for partitioning the pixels 812. An overcoat layer 815 and an electrode layer 816 are sequentially formed on the colored layers 813 and the partitions 814.

Next, a manufacturing method of the liquid crystal display device 801 will be described. First, the partitions 814 are formed on the transparent substrate 811, and then, the R (red), G (green) and B (blue) colored layers 813 are formed on the pixel portions. Next, the overcoat layer 815 is formed by spin-coating transparent acryl resin paint, and then, the electrode layer 816 made of ITO (indium tin oxide) is formed to complete the color filter 802.

The pixel electrodes 805 and the TFT elements are formed on the counter substrate 803. Next, the completed color filter 802 and the counter substrate 803 having the pixel electrodes 805 formed thereon are provided with the alignment films 806, respectively, and then, are bonded to each other. Finally, the liquid crystal composition 804 is sealed between the color filter 802 and the counter substrate 803, and then, the polarizing plates 807 and a backlight are laminated.

This embodiment of the liquid droplet discharge apparatus of the invention may be used to form the filter elements (R (red), G (green) and B (blue) colored layers 813) of the color filter. In addition, this embodiment may be used to form the pixel electrodes 805 by using liquid material corresponding to the pixel electrodes 805.

As other electro-optical devices, devices manufactured through processes including forming preparations, in addition to forming metal wiring lines, lenses, resists, optical diffusers and the like. By applying the liquid droplet discharge apparatus to various kinds of electro-optical devices, it is possible to manufacture various electro-optical devices with high efficiency.

Electronic apparatuses of the invention have the above-described electro-optical devices. The electronic apparatuses may include various electronic appliances in addition to portable telephones and personal computers equipped with a flat panel display.

Figure 15:
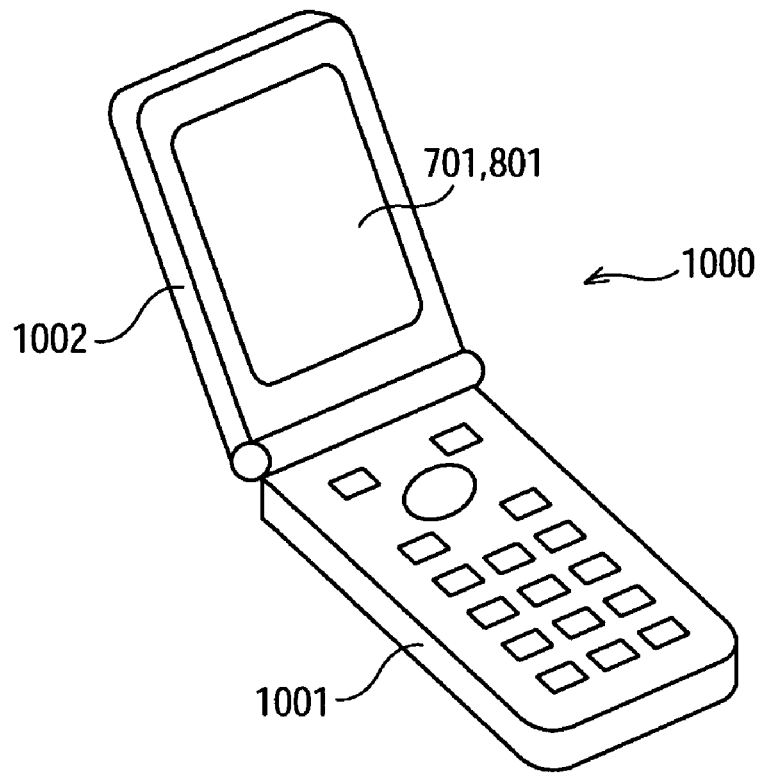
FIG. 15 is a perspective view illustrating a portable telephone as an example of an electronic apparatus equipped with a display unit manufactured according to an embodiment of the invention.

FIG. 15 shows a shape of a portable telephone 1000 as an example of an electronic apparatus. The portable telephone 1000 has a body 1001 and a display unit 1002. The display unit 1002 employs the organic EL device 701 or the liquid crystal display device 801 as an example of the electro-optical device as described above.

Figure 16:
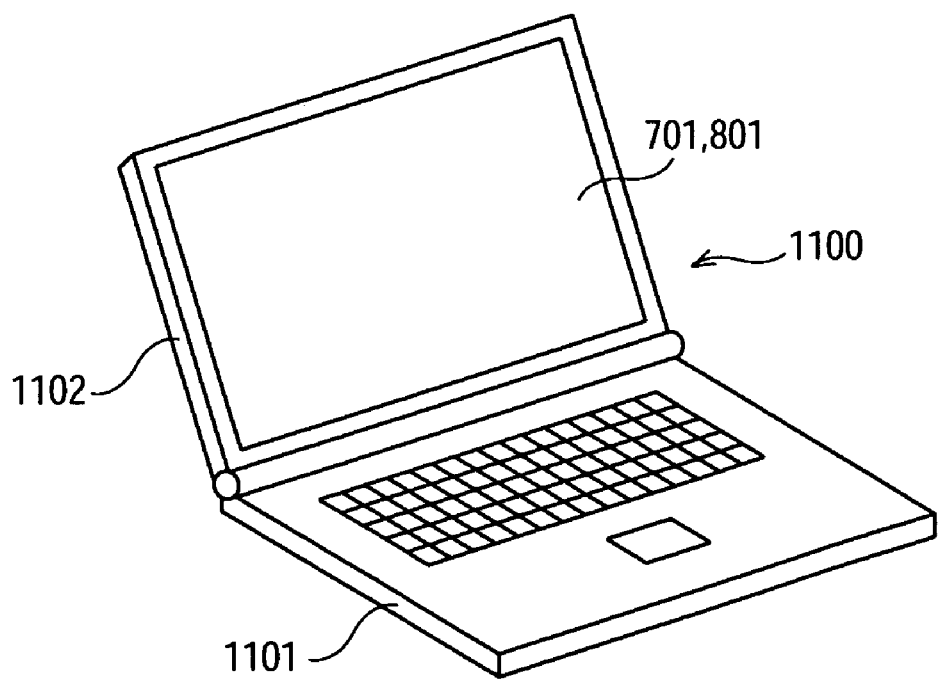
FIG. 16 is a perspective view illustrating a computer as another example of the electronic apparatus.

FIG. 16 shows a computer 1100 as another example of the electronic apparatus. The computer 1100 has a body 1101 and a display unit 1102. The display unit 1102 can employ the organic EL device 701 or the liquid crystal display device 801 as an example of the electro-optical device as described above.

This embodiment of the liquid droplet discharge apparatus of the invention may be used to perform black-and-white or color printing on a printing object as an example of the work. In such a case, the liquid storing unit corresponds to an ink cartridge in which a single or a plurality of inks (for example, black, yellow, magenta, cyan, light cyan, light magenta and the like) is stored. Each ink is an example of liquid.

Although the first tube and the second tube are flexible in the above-described embodiment, they are not limited to this and may be non-flexible. In addition, the fluid circulating unit 430 shown in FIG. 6 may circulate the deaerating fluid 660 more forcibly by using a circulating pump. The filters 450 are preferably interchangeable. The liquid packs as the ink tank are arranged at positions different from the position of the head, that is, are of an off-carriage type shown and described in the example. However, without any limitation, the liquid packs may be loaded on a carriage on which the head 11 is loaded, that is, may be of an on-carriage type.

For example, it may be considered to use an ink tube formed by a combination of a plurality of layers made of ink solvent-resistant material or material with high gas barrier property. However, in such a case, since material of the ink tube is varied depending on the kind of ink solvent, expensive and exclusive multi-layered tubes must be prepared for each time.

However, according to the embodiment of the invention, material of the tube may be selected considering only solvent-resistance to liquid such as ink being used or the like.

In addition, since the deaerating fluid in the space between the second tube as an outer layer and the first tube as an inner layer actively accepts gases permeating from an external atmosphere, for example, gas barrier property for the coating ink is excellent, stability of inkjet image drawing can be improved, and functional characteristics of coated liquid can be stabilized.

Since the multi-layered tubes made of different material are integrally formed, the tubes cannot be all disused after they are exhausted. However, according to the embodiments of the invention, the first tube and the second tube are formed separately, and accordingly, may be properly disposed of or recycled separately.

The invention is not limited to the above-described embodiments and may be modified in various ways without departing from the spirit and scope of the invention. Further, the above embodiments may be configured in combination.

What is claimed is:

1. A liquid droplet discharge apparatus that discharges liquid droplets onto a work, the liquid droplet discharge apparatus comprising:
    a liquid container that contains liquid;
    a head that discharges the liquid droplets; and
    a liquid supply device that is disposed between the liquid container and the head and that supplies the liquid from the liquid container to the head,
    wherein the liquid supply device includes:
    a first tube connected between the liquid container and the head that supplies the liquid;
    a second tube surrounding an outer circumference of the first tube; and
    a fluid circulating unit that contains deaerating fluid in a space defined between the first tube and the second tube to circulate the deaerating fluid while deaerating gases contained in the deaerating fluid to outside the second tube through the second tube.

2. A liquid droplet discharge apparatus according to claim 1,
    wherein the deaerating fluid is the same liquid as the liquid or a solvent contained in the liquid.

3. A liquid droplet discharge apparatus that discharges liquid droplets onto a work, the liquid droplet discharge apparatus comprising;
    a liquid container that contains liquid;
    a head that discharges the liquid droplets; and
    a liquid supply device that is disposed between the liquid container and the head and that supplies the liquid from the liquid container to the head,
    wherein the liquid supply device includes:
    a first tube connected between the liquid container and the head that supplies the liquid;
    a second tube surrounding an outer circumference of the first tube; and
    a fluid circulating unit that contains deaerating fluid in a space defined between the first tube and the second tube to circulate the deaerating fluid while deaerating gases contained in the deaerating fluid to outside the second tube through the second tube;
    wherein the fluid circulating unit includes:
    a sucking unit;
    a circulating tube connected to the space in which the deaerating fluid is circulated by suction of the sucking unit; and
    a filter that separates the gases from the circulating deaerating fluid.

4. A liquid droplet discharge apparatus that discharges liquid droplets onto a work, the liquid droplet discharge apparatus comprising:
    a liquid container that contains liquid;
    a head that discharges the liquid droplets and
    a liquid supply device that is disposed between the liquid container and the head and that supplies the liquid from the liquid container to the head,
    wherein the liquid supply device includes:
    a first tube connected between the liquid container and the head that supplies the liquid;
    a second tube surrounding an outer circumference of the first tube; and
    a fluid circulating unit that contains deaerating fluid in a space defined between the first tube and the second tube to circulate the deaerating fluid while deaerating gases contained in the deaerating fluid to outside the second tube through the second tube;
    wherein spacers are arranged in the space defined between the first tube and the second tube in order to maintain the space along a longitudinal direction of the first tube and the second tube.

5. The liquid droplet discharge apparatus according to claim 4,
    wherein the spacers are arranged with a regular separation in the longitudinal direction of the first tube and the second tube.

6. The liquid droplet discharge apparatus according to claim 5,
    wherein the spacers are ring-shaped members fixed between an outer circumferential surface of the first tube and an inner circumferential surface of the second tube, and
    wherein the spacer includes a circular passage hole for passing the first tube through, and projections for forming a fluid passage of the deaerating fluid between the outer circumferential surface of the first tube and the inner circumferential surface of the second tube.

7. A liquid supply device provided in a liquid droplet discharge apparatus that discharges liquid droplets onto a work, the liquid supply device disposed between a liquid container and a head to supply the liquid from the liquid container to the head, the liquid supply device comprising:
    a first tube connected between the liquid container and the head that supplies the liquid;
    a second tube surrounding an outer circumference of the first tube; and a fluid circulating unit that contains deaerating fluid in a space defined between the first tube and the second tube to circulate the deaerating fluid while deaerating gases contained in the deaerating fluid to outside the second tube through the second tube.

8. An electro-optical device manufactured using a liquid droplet discharge apparatus that discharges liquid droplets from a head onto a work, wherein a liquid supply device disposed between a liquid container and the head to supply the liquid from the liquid container to the head, the liquid supply device comprising:

a first tube connected between the liquid container and the head that supplies the liquid; and a second tube surrounding an outer circumference of the first tube that supplies the liquid, and wherein the electro-optical device is manufactured by discharging the liquid droplets from the head onto the work by using a fluid circulating unit that contains deaerating fluid in a space defined between the first tube and the second tube to circulate the deaerating fluid while deaerating gases contained in the deaerating fluid to outside the second tube through the second tube.

9. An electronic apparatus equipped with the electro-optical device according to claim 8.

* * * * *